US010522904B2

(12) United States Patent
Song et al.

(10) Patent No.: US 10,522,904 B2
(45) Date of Patent: Dec. 31, 2019

(54) TRANSPARENT PANE ASSEMBLY WITH INTEGRATED ANTENNA SYSTEM

(71) Applicant: GM GLOBAL TECHNOLOGY OPERATIONS LLC, Detroit, MI (US)

(72) Inventors: Hyok Jae Song, Oak Park, CA (US); James H. Schaffner, Chatsworth, CA (US); Arthur Bekaryan, Northridge, CA (US); Timothy J. Talty, Beverly Hills, MI (US); Eray Yasan, Canton, MI (US); Duane S. Carper, Davison, MI (US); Walter S. Wall, Santa Monica, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 15/975,246

(22) Filed: May 9, 2018

(65) Prior Publication Data

US 2019/0348753 A1 Nov. 14, 2019

(51) Int. Cl.
| | |
|---|---|
| H01Q 1/32 | (2006.01) |
| H01R 24/50 | (2011.01) |
| H01P 3/08 | (2006.01) |
| H05K 1/02 | (2006.01) |
| H05K 1/11 | (2006.01) |
| B60R 16/023 | (2006.01) |
| B60J 1/02 | (2006.01) |
| H01R 103/00 | (2006.01) |

(52) U.S. Cl.
CPC ............... *H01Q 1/325* (2013.01); *B60J 1/02* (2013.01); *B60R 16/023* (2013.01); *H01P 3/08* (2013.01); *H01R 24/50* (2013.01); *H05K 1/0237* (2013.01); *H05K 1/111* (2013.01); *H01R 2103/00* (2013.01); *H05K 2201/10189* (2013.01)

(58) Field of Classification Search
CPC .......... H01Q 1/1271; H01Q 1/32; H01Q 1/325
See application file for complete search history.

(56) References Cited

U.S. PATENT DOCUMENTS

| 5,923,298 A * | 7/1999 | Miyahara | H01Q 1/1271 343/713 |
|---|---|---|---|
| 5,999,134 A * | 12/1999 | Dishart | B32B 17/10036 343/713 |
| 8,686,906 B2 * | 4/2014 | White | H01Q 9/0457 343/700 MS |
| 2003/0034926 A1 * | 2/2003 | Veerasamy | H01Q 1/1271 343/713 |

* cited by examiner

*Primary Examiner* — Hoang V Nguyen
(74) *Attorney, Agent, or Firm* — Cantor Colburn LLP

(57) ABSTRACT

A transparent pane assembly including a transparent pane, an antenna and an electromagnetic connector assembly. The transparent pane includes first and second layers made of a dielectric substrate, and the second layer includes opposite first and second faces. The antenna is disposed between the first and second layers, and is attached to the first face. The electromagnetic connector assembly includes a metal bonding pad, a coaxial connector, and a printed circuit board. The bonding pad is adhered to the second face and aligned to a feed portion of the antenna for electromagnetic coupling. The circuit board includes opposite first and second sides and an electrically conductive trace carried by the second side. The coaxial connector is electrically connected to the PCB at the second side, and the electrically conductive trace is in electrical contact with the metal bonding pad.

16 Claims, 4 Drawing Sheets

TRANSPARENT PANE ASSEMBLY WITH INTEGRATED ANTENNA SYSTEM

INTRODUCTION

The present disclosure relates to antennas, and more particularly, to antennas integrated into translucent panes.

Modern vehicles employ antennas to receive and transmit signals for communications systems, such as terrestrial radio (AM/FM), cellular telephone, satellite radio, dedicated short range communications (DSRC), GPS, etc. Cellular telephone with 4G long term evolution (LTE) requires at least two antennas to provide multiple-input multiple-output (MIMO) operation. Other communications protocols may also require two or more antennas. The antennas used for these systems are often mounted to a roof of the vehicle so as to provide maximum reception capability. Many of these antennas are often integrated into a common structure and housing mounted to the roof of the vehicle, such as a "shark-fin" roof mounted antenna module. As the number of antennas on a vehicle increases, the size of the structures required to house all of the antennas in an efficient manner and to provide maximum reception capability also increases; which may interfere with the design and styling of the vehicle. Automotive engineers and designers are looking for other suitable areas on the vehicle to place antennas that may not interfere with vehicle design and structure.

SUMMARY

A transparent pane assembly according to one, non-limiting, embodiment of the present disclosure includes a transparent pane, an antenna, and an electromagnetic connector assembly. The transparent pane includes first and second layers made of a dielectric substrate. The second layer includes opposite first and second faces. The antenna is disposed between the first and second layers, and is attached to the first face. The antenna includes a feed portion. The electromagnetic connector assembly includes a metal bonding pad, a coaxial connector, and a printed circuit board (PCB). The metal bonding pad is adhered to the second face and aligned to the feed portion for electromagnetic coupling. The PCB includes opposite first and second sides, and an electrically conductive trace carried by the second side. The coaxial connector is electrically connected to the PCB at the second side, and the electrically conductive trace is in electrical contact with the metal bonding pad.

Additionally to the foregoing embodiment, the feed portion, the metal bonding pad, and the electrically conductive trace are coplanar.

In the alternative or additionally thereto, in the foregoing embodiment, the feed portion, the metal bonding pad, and the electrically conductive trace include matching footprints.

In the alternative or additionally thereto, in the foregoing embodiment, the feed portion, the metal bonding pad, and the electrically conductive trace each include a U-shaped element and a central element spaced from the U-shaped element.

In the alternative or additionally thereto, in the foregoing embodiment, the U-shaped element is a ground plane and the central element is a transmitting element.

In the alternative or additionally thereto, in the foregoing embodiment, the PCB includes a plurality of vias adapted to electrically connect the electrically conductive trace to the coaxial connector.

In the alternative or additionally thereto, in the foregoing embodiment, the electromagnetic connector assembly includes an adhesive adapted to attach the second face to the second side.

In the alternative or additionally thereto, in the foregoing embodiment, the adhesive is located between the electrically conductive trace and the metal bonding pad.

In the alternative or additionally thereto, in the foregoing embodiment, the coaxial connector is a FAKRA connector.

In the alternative or additionally thereto, in the foregoing embodiment, the transparent pane includes a first area and a second area adjacent to the first area. The antenna includes a first portion spanning across the first area and a second portion spanning across the second area. The first portion is of a density that is greater than a density of the second portion, and the feed portion is electrically connected to the first and second portions.

In the alternative or additionally thereto, in the foregoing embodiment, the antenna is coplanar with the transparent pane.

In the alternative or additionally thereto, in the foregoing embodiment, the transparent pane is a windshield.

In the alternative or additionally thereto, in the foregoing embodiment, the transparent pane is laminated safety glass that includes a flexible layer disposed between the first and second layers, with the antenna disposed between the flexible layer and the second layer, and the first and second layers are glass layers.

An antenna system according to another, non-limiting, embodiment of the present disclosure is adapted to be integrated into a translucent pane of a dielectric substrate. The antenna system includes an antenna and an electromagnetic connect assembly. The antenna is adapted to be encased in the translucent pane, and includes an electrical feed portion. The electromagnetic connector assembly includes a printed circuit board (PCB) having opposite first and second sides and at least one via each extending between the first and second sides. The coaxial connector is electrically attached to the at least one via at the first side. The electrically conductive trace is carried by the second side and is electrically attached to the at least one via. The electrically conductive trace is adapted to transfer electrical energy to the electrical feed portion.

Additionally to the foregoing embodiment, an electrically conductive bonding pad is adapted to be adhered to the translucent pane and aligned to the electrical feed portion for electromagnetic coupling. The electrically conductive trace is adapted to be in electrical contact with the electrically conductive bonding pad.

In the alternative or additionally thereto, in the foregoing embodiment, a footprint of the electrical feed portion and a footprint of the electrically conductive bonding pad are matching.

In the alternative or additionally thereto, in the foregoing embodiment, the footprint of the electrically conductive bonding pad matches a footprint of the electrically conductive trace.

In the alternative or additionally thereto, in the foregoing embodiment, the coaxial connector is a FAKRA connector.

An automotive windshield assembly according to another, non-limiting embodiment includes a transparent pane, an antenna, a metallic bonding pad, a coaxial connect, and a printed circuit board (PCB). The transparent pane is made, at least in-part, of a dielectric substrate. The antenna is encased inside the transparent pane, and includes an electrically conductive feed portion. The metallic bonding pad is adhered to a face of the transparent pane, and is aligned to the feed portion for electromagnetic coupling. The PCB includes opposite first and second sides, a plurality of vias, and an electrically conductive trace. The plurality of vias extend between the first and second sides. The electrically conductive trace is carried by the second side. The coaxial connector is electrically connected to the plurality of vias at the second side, and the electrically conductive trace is electrically connected to and between the metallic bonding pad and the plurality of vias. The metallic bonding pad is spaced from the electrically conductive feed portion by the dielectric substrate.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

The following description is merely exemplary in nature and is not intended to limit the present disclosure, its application or uses. For example, the present disclosure describes an antenna adhered to, or integrated into, automotive glass. However, as will be appreciated by those skilled in the art, the antenna has application for dielectric structures other than automotive glass where maintaining a clear viewing area is desirable.

With the use of planar antennas fixed to, or integrated into, transparent panes, it may be desirable to optimize the transmission of light through the pane, and/or a direction of unrestricted sight through the pane. A tradeoff exists between this degree of transparency and any obstruction caused by the antenna. In general, the greater the viewing, or light transmission, through an area of the transparent pane containing the antenna, the lower is the antenna conductivity, thus the lower is the antenna reception and signal transmission. Stated in another way, the denser the antenna wire concentration, the better is the conductor performance as an antenna receiver. Conversely, thicker wires and/or a greater concentration of wires results in a diminished amount of light that is able to pass through the wire pattern and thus through the transparent pane. It is advantageous to provide an antenna structure having two different density concentrations based on the viewing area and location of the antenna feed, which results in overall antenna performance that meets or exceeds conventional antenna designs.

Figure 1:
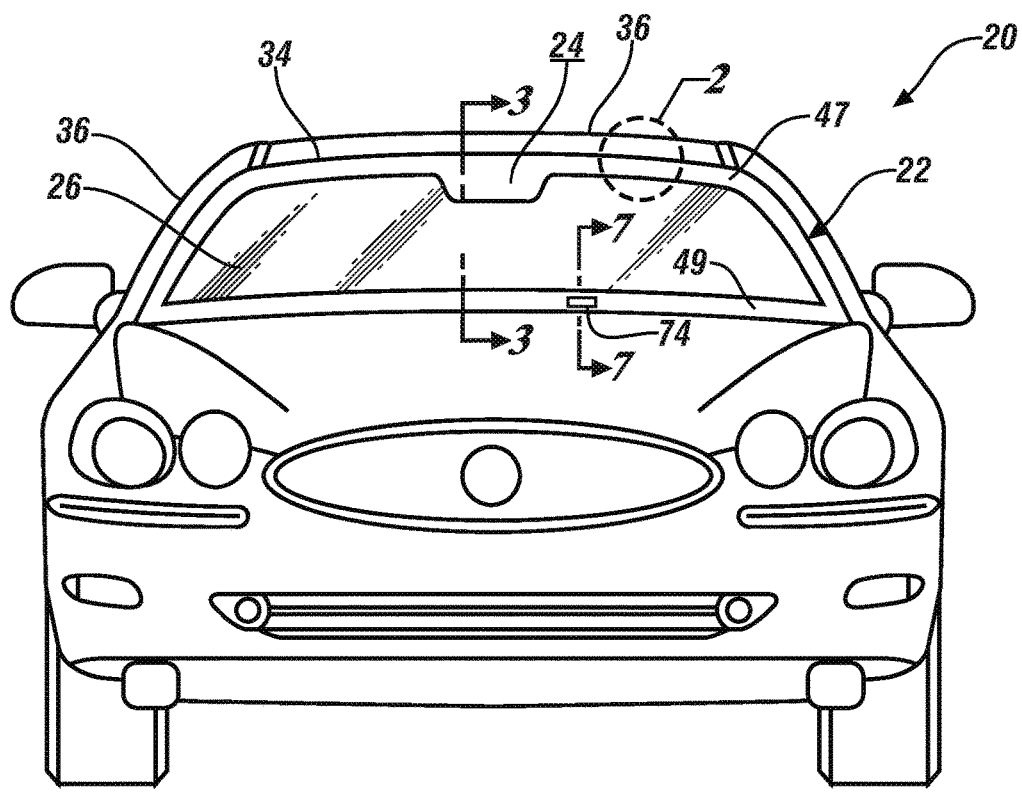
FIG. 1 is a front view of a vehicle illustrating one, non-limiting, application of a transparent pane assembly.

Reviewing to FIG. 1, a front view of a vehicle 20 is illustrated as one, non-limiting, application of a translucent pane assembly 22 of the present disclosure. The translucent pane assembly 22 may include an antenna 24, a translucent pane 26 generally made of a dielectric substrate, and a trim component 28 (see FIGS. 2 and 3). The antenna 24 is configured to support any one or more of various communications systems. As examples, the antenna 24 may be an AM/FM radio antenna, a WiFi antenna, a dedicated short range communications (DSRC) antenna, a satellite radio antenna, a satellite-based positioning system antenna (e.g., GPS antenna), a cellular antenna, including multiple-input multiple-output (MIMO) antennas, and others. Although the translucent pane 26 is illustrated as a front, vehicle windshield, other examples include a rear vehicle windshield, side vehicle windows, a vehicle sunroof, and any other translucent pane structure adapted to transmit light and/or support visual viewing there-through and not limited to vehicles.

Figure 2:
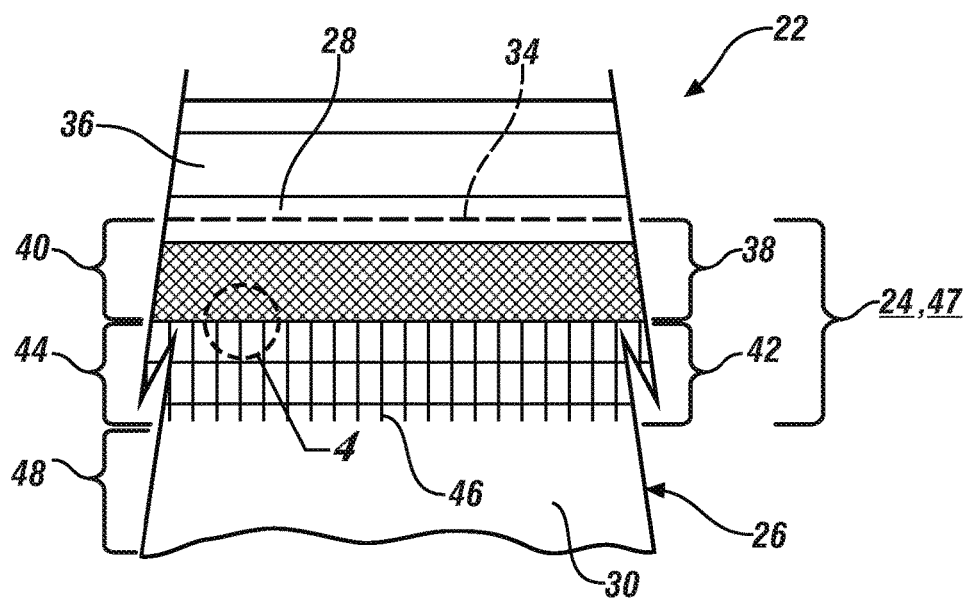
FIG. 2 is an enlarged, partial view of the transparent pane assembly taken from circle 2 of FIG. 1.
Figure 3:
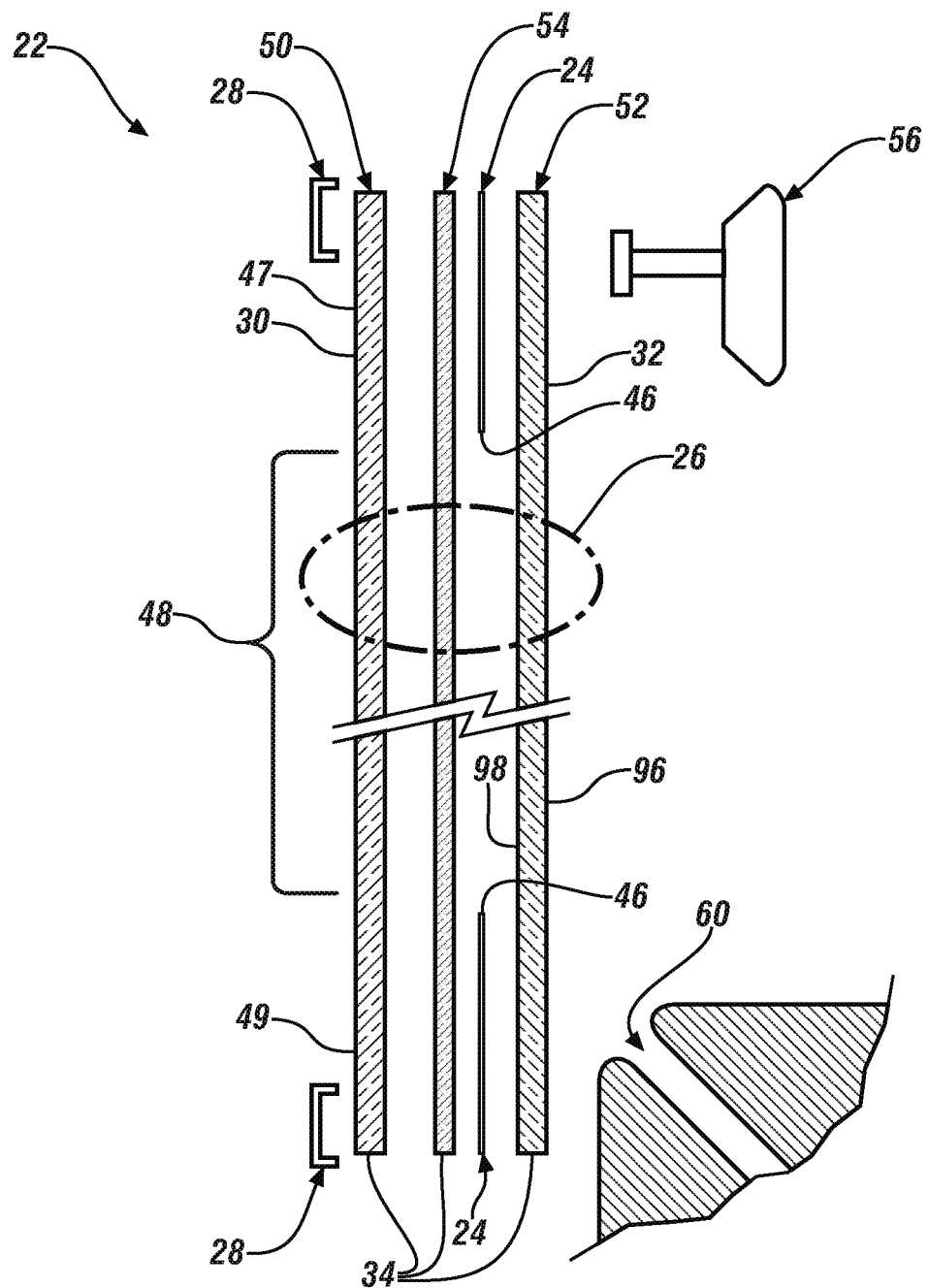
FIG. 3 is a disassembled cross section of the transparent pane assembly viewing in the direction of arrows 3-3 in FIG. 1.

Referring to FIGS. 1 through 3, the translucent pane 26 includes a surface 30 that may be an exterior surface, and an opposite surface 32 (see FIG. 3) that may be an interior surface. In the example of the vehicle 20, an occupant or driver would view the roadway and surrounding environment through the translucent pane 26, and generally without obstruction by the antenna 24. The trim component 28 may be an exterior trim piece that generally co-extends with an edge, or outer perimeter 34 of the translucent pane 26, and is adapted to, at least in-part, secure the translucent pane 26 to (for example) body panel(s) 36 of the vehicle 20.

Referring to FIG. 2, the planar antenna 24 includes a first portion 38 spanning across an entire first area 40 of the translucent pane 26, and a second portion 42 spanning across an entire second area 44 of the translucent pane 26 disposed adjacent to the first area 40. The first portion 38 has a density (i.e., electrical conductor density) that is greater than a density of the second portion 42. Because the density of the first portion 38 is greater the density of the second portion 42, the first portion 38 is less translucent than the second portion 42. In one embodiment, the first portion 38 is substantially opaque. The first portion 38 may be elongated and longitudinally co-extends with at least a portion of the perimeter 34, and thus co-extends with at least a portion of the trim component 28.

The first portion 38 of the antenna 24 spans laterally between the perimeter 34 of the translucent pane 26 and the second portion 42. From the first portion 38, the second portion 42 projects laterally inward, away from the perimeter 34 and across the translucent pane 26. In one embodiment, the antenna 24 may extend longitudinally along the entire perimeter 34 (i.e., extends continuously, see FIG. 1)). In this example, a fringe 46 of the second portion 42 at a top segment 47 of the translucent pane 26 is spaced from the same, but opposing fringe of the same second portion at a bottom segment 49 of the translucent pane 26. This configuration maintains a clear, central, segment 48 of the translucent pane 26 for unobstructed viewing and/or light transmission.

Referring to FIGS. 2 and 3, the translucent pane 26 may be a laminated safety glass including an exterior glass layer 50, an interior glass layer 52, and a flexible layer 54 adhered to and disposed between the exterior and interior glass layers 50, 52. The antenna 24 may be disposed between the flexible layer 54 and the interior glass layer 52, offering a degree of physical protection, and not inhibiting cleaning of the exterior and interior surfaces 30, 32 of the translucent pane assembly 22. In another embodiment, the antenna 24 may be located between the flexible layer 54 and the exterior layer 50. It is further contemplated and understood that the antenna 24 may be adhered to the exterior surface 30 or the interior surface 32 via an adhesive, or the antenna 24 may be imprinted on a flexible translucent film (not shown) that may then be adhered to one of the surfaces 30, 32. One, non-limiting, example of a material of the flexible layer is polyvinyl butyral (PVB).

In another embodiment, the antenna 24 may be located directly between two flexible layers. The two flexible layers may each have a thickness that is about half the thickness of the flexible layer 54 previously described. When fully assembled, one flexible layer is located between the exterior glass layer 50 and the antenna 24, and the other flexible layer is located between the interior glass layer 52 and the antenna 24.

When the translucent pane assembly 22 is fully assembled, the antenna 24 serves a dual purpose. The first purpose assists in communications, and the second purpose provides a visually pleasing transition from the trim component 28 and toward the central segment 48 of the translucent pane 26 particularly when viewing the translucent pane assembly 22 from the outside of, for example, the vehicle 20.

In another embodiment, the translucent pane assembly 22 further includes a rearview mirror 56 (see FIG. 3). The rearview mirror 56 may attach to the interior surface 32 of the translucent pane 26 at the first area 40. In this example, the first portion 38 of the antenna 24 may be substantially opaque and may aesthetically block a view of the mirror 56 when viewing from the outside of the vehicle 20. This is not only aesthetically pleasing but reduces the sun glare at and around the rearview mirror 56 for an operator of the vehicle 20. In furtherance of this example, the antenna 24 may longitudinally extend across the entire top segment 47 of the translucent pane 26 (i.e., includes at least a portion of the first and second areas 40, 44, see FIG. 2). By extending across the top segment 58, the antenna 24 can also reduce sun glare for the driver and occupant(s), thereby replacing the more conventional tinting of the top segment of the translucent pane 26.

In another embodiment, the translucent pane assembly 22 may be adjacent to, or may include, a dash mounted defrost vent 60. Similar to the application of the rearview mirror 56, the antenna 24 may further function to mask the sight of the vent 60 when viewing the translucent pane assembly 22 from the outside of, for example, the vehicle 20.

Figure 4:
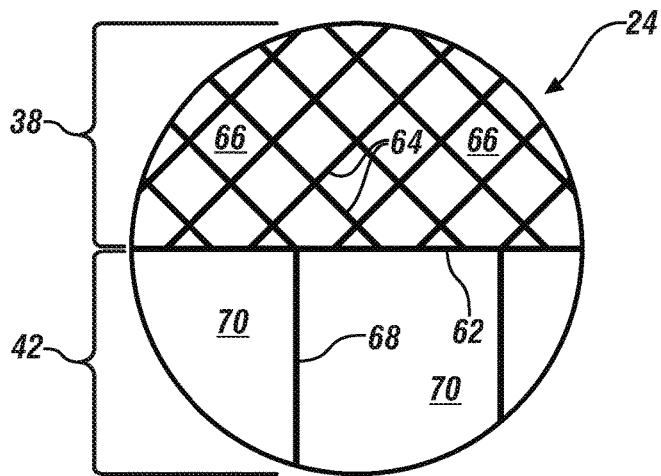
FIG. 4 is an enlarged, partial, view of an antenna of the transparent pane assembly taken from circle 4 of FIG. 2.

Referring to FIG. 4 and in one embodiment, the antenna 24 may further include an electrically conductive feed line 62 extending between the first and second portions 38, 42. The first portion 38 may be a pattern including a plurality of electrically conductive filaments 64 that crisscross one-another to form a plurality of repeating cells 66. Similarly, the second portion 42 of the antenna 24 may be another pattern including a plurality of electrically conductive filaments 68 that crisscross one-another to form a plurality of repeating cells 70. The cells 66, 70 generally designate small areas of clear-viewing through the translucent pane 26. The filaments 64, 68 may generally be of the same girth, each having similar electrical properties. The number of cells 66 of the first portion 38 are greater than the number of cells 70 of the second portion 42 when counted over an equivalent area. The feed line 62 connects to end portions of each one of the filaments 64, 66 to directly feed current to each filament 64, 66 for optimal antenna performance.

Figure 5:
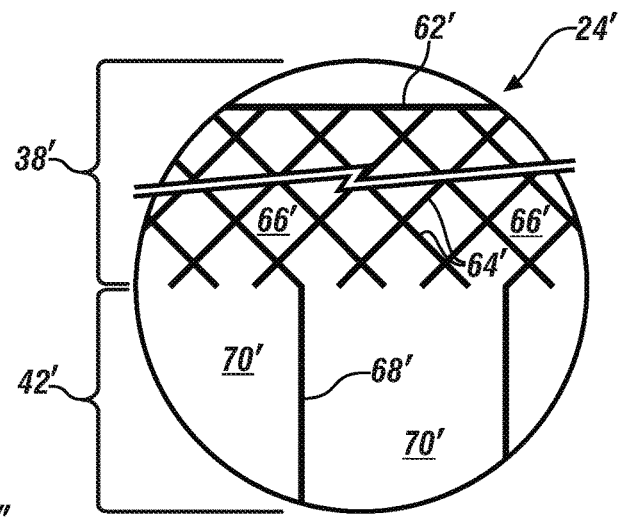
FIG. 5 is a an enlarged, partial, view of a second embodiment of the antenna.

Referring to FIG. 5 and in another embodiment of the antenna, where like elements to the first embodiment have like identifying numerals except with the addition of a prime symbol suffix, a first portion 38' of an elongated antenna 24' is disposed laterally between a feed line 62' and a second portion 42'. In this embodiment, the feed line 62' provides electrical current directly to each filament 64' of the first portion 38'. Some of the filaments 64' may provide electrical current to most or all of the filaments 68' of the second portion 42'. In addition, or alternatively, the electrical energy may 'jump' through the glass material, and from the filaments 64' to the filaments 68' to assist in antenna performance. In this embodiment, the feed line 62' may be positioned behind a peripheral trim component (not shown in FIG. 5), thus generally hidden from view.

Figure 6:
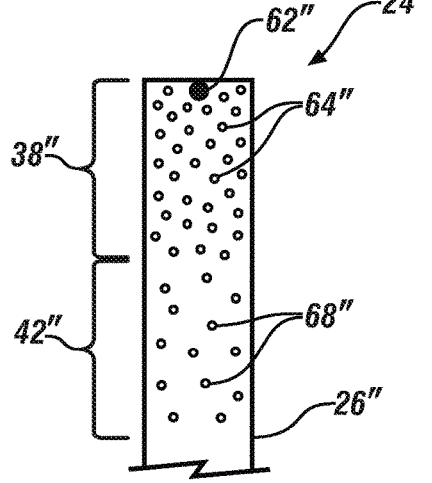
FIG. 6 is an enlarged, partial, view of a third embodiment of the antenna.

Referring to FIG. 6 and in another embodiment of the antenna, where like elements to the second embodiment have like identifying numerals except with the addition of a double prime symbol suffix, a feed line 62" of an antenna 24" may generally feed electrical energy to a plurality of electrically conductive particulates 64" of a first portion 38" of the antenna 24". In turn, the electrically conductive particulates 64" may feed electrically energy (or via a feed line) to a plurality of electrically conductive particulates 68" of a second portion 42". The particulates 64", 68" may be of the same material and generally of the same size. However, the particulates 66" are more sparsely located than the particulates 64". The particulates 64", 68" may be integrated into, infused, and/or otherwise suspended in a translucent pane 26". The particulates 64", 68" may be made of a transparent, or semi-transparent conducting oxide (TCO) that may be indium tin oxide (ITO).

In yet another embodiment, not illustrated, the first portion 38 of the antenna 24 may be a film of TCO, and the second portion 42 may be a film of TCO that is thinner than the first portion 38. In another embodiment, not illustrated, the antenna 24 may be adhered to one, or both, of the glass layers 50, 52, or the layer 54, by an adhesive layer that may be any suitable adhesive or transfer tape. In one embodiment, the antenna 24 may be adhered to, or printed upon, a flexible film substrate that includes the adhesive layer to be secured to one of the glass layers 50, 52. The adhesive or transfer tape can be transparent or near transparent so as to have a minimal impact on the appearance and light transmission through the antenna 24. The antenna 24 can be protected by a low RF loss passivation layer (not shown), such as parylene.

Figure 7:
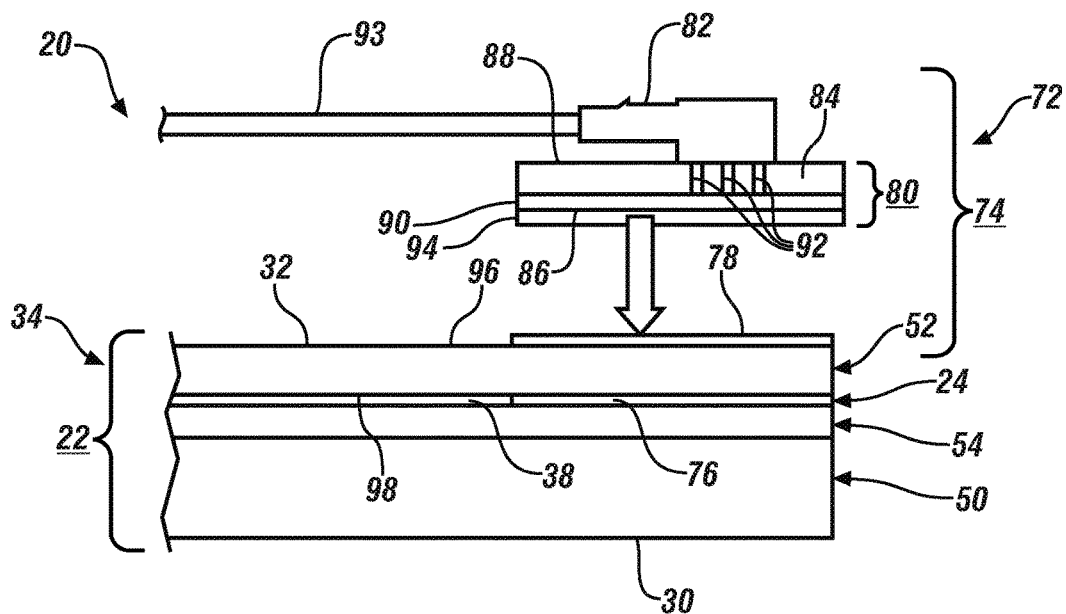
FIG. 7 is a partial cross section of an antenna system of the transparent pane assembly, and taken from line 7-7 of FIG. 1.

Referring to FIGS. 1 and 7, the translucent pane assembly 22 may include an antenna system 72 having the antenna 24 and an electromagnetic (EM) connector assembly 74 adapted to electromagnetically couple to an electrically conductive feed portion 76 (e.g., metallic) of the antenna 24. Because the antenna 24, including the feed portion 76, is encased in the translucent pane 26, the antenna system 72 provides the needed transitioning from the antenna 24 to a radio frequency (RF) cabling system that then connects to a receiving/transmitting module (not shown).

The feed portion 76 may be part of the first portion 38 of the antenna 24, or may be directly, electrically, connected to the first portion 38. In another embodiment, the feed portion 76 may be directly connected to the feed line 62 (see FIG. 4).

Referring to FIG. 7, the EM connector assembly 74 may include an electrically conductive (e.g., metallic) bonding pad 78, a printed circuit board (PCB) 80, and a coaxial connector 82. The PCB 80 includes a board substrate 84 having opposite sides 86, 88, an electrically conductive trace 90 carried by the side 86, and a plurality of vias 92 (i.e., three illustrated) that extend through the board substrate 84 and between the sides 86, 88. The coaxial connector 82 is adapted to electrically connect to end portions of the vias 92 generally at the surface 88 of the board substrate 84. Opposite end portions of the vias 92 are electrically connected to the trace 90 at the surface 86. The board substrate 84 is electrically nonconductive. In one embodiment, and when the EM connector assembly 74 is assembled, the antenna 24, the translucent pane 26, the electrically conductive bonding pad 78, the board substrate 84, and the electrically conductive trace 90 are substantially coplanar to one-another. According to one embodiment, the coaxial connector 82 can be any suitable RF or microwave connector configured for connecting a coaxial cable 93 to the EM connector assembly 74.

The coaxial connector 82 may be an industry standard connector such as a connector meeting the FAKRA international connector standard. One benefit of using a FAKRA connector is the avoidance of specialty tooling to manufacture custom EM connector parts. FAKRA connectors are SubMiniature version B (SMB) style connectors and have been the standard RF connector in the automotive industry, and among other markets. SMB connectors feature a snap-on coupling and are available in either 50 Ohm, or 75 Ohm, impedance. The SMB connectors offer excellent electrical performance from DC to four (4) GHz. An SMB jack has a male center pin, while an SMB plug has a female basket. This design is consistent for transmission of signals via coaxial cabling, and other cable types.

The interior glass layer 52 includes an interior face 96 (i.e., the interior surface 32 of the translucent pane 26) and an opposite face 98 that may be an internal face with respect to the translucent pane 26. The internal face 98 may be in direct contact with the antenna 24 including the feed portion 76.

The bonding pad 78 is pre-attached to the interior face 96 of the interior glass layer 52 by any variety of methods including adhesion, ultrasonic bonding, additive manufacturing, and other methods generally known in the art. When attached to the interior surface 32, the bonding pad 78 is spaced from the feed portion 76 of the antenna 24 by the interior glass layer 52 (i.e., the thickness thereof). In one embodiment, the trace 90 may be secured to the bonding pad 78 by an adhesive layer 94 disposed there-between. In another embodiment, the bonding pad 78 may be attached to the exterior surface 30 of the translucent pane 26.

Figure 8:
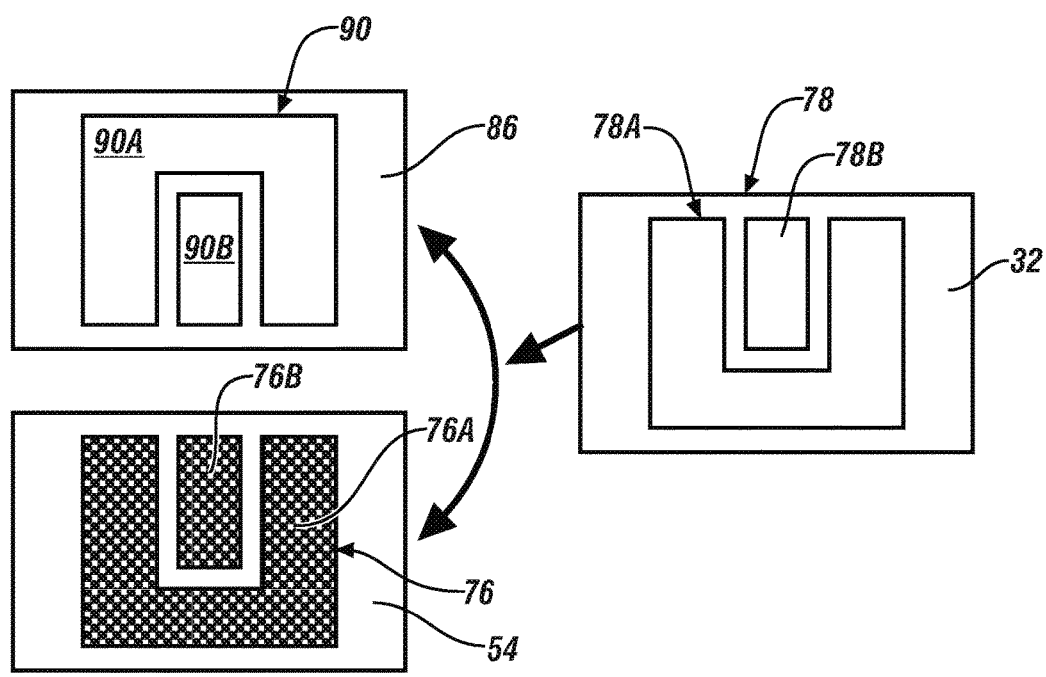
FIG. 8 is a disassembled plan view of an electromagnetic connector assembly of the antenna system.

Referring to FIGS. 7 and 8, and in an embodiment, the feed portion 76 may generally be an end portion of an antenna leg, and includes a footprint (i.e., pattern or two-dimensional planar shape). In one embodiment, the footprint of the feed portion 76 (i.e., the EM coupling geometry) substantially matches a footprint of the bonding pad 78 and a footprint of the trace 90. As such, the footprints of the feed portion 76, the bonding pad 78, and the trace 90 may each include respective elements 76A, 78A, 90A, and respective elements 76B, 78B, 90B. The elements 76A, 78A, 90A may be substantially U-shaped, and may be electrical ground elements, or EM ground planes. The elements 76B, 78B, 90B may be quadrilateral in shape, and may be electrical signal planes. When the antenna system 72 is assembled, the footprints of the feed portion 76, the bonding pad 78, and the trace 90 are substantially aligned to one-another (i.e., silhouette one-another).

As best shown in FIG. 8, the elements 76B, 78B, 90B may be centralized with respect to the U-shaped elements 76A, 78A, 90A. The U-shaped EM ground elements 76A, 90A and centralized signal elements 76B, 90B are configured to electromagnetically carry frequencies of signals that can vary according to antenna design. For example, in one aspect the antenna 24 may be configured to operate at frequencies from seven hundred (700) MHz up to six (6) GHz. Other RF signal ranges are contemplated.

Advantages and benefits of the present disclosure includes optimal packaging of an antenna system, and ideal trade-offs between transparency and conductivity of an antenna of the antenna system. Other advantages include the novel, dual purpose, use of a planar antenna, and an efficient means of transitioning from a planar antenna embedded within a translucent pane to a coaxial cable.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A transparent pane assembly comprising:
   a transparent pane including first and second layers made of a dielectric substrate, and the second layer including opposite first and second faces;
   an antenna disposed between the first and second layers, and attached to the first face, the antenna including a feed portion; and
   an electromagnetic connector assembly including a metal bonding pad adhered to the second face and aligned to the feed portion for electromagnetic coupling, a coaxial connector, and a printed circuit board (PCB), the PCB including opposite first and second sides and an electrically conductive trace carried by the second side, wherein the coaxial connector is electrically connected to the PCB at the second side and the electrically conductive trace is in electrical contact with the metal bonding pad.

2. The transparent pane assembly set forth in claim 1, wherein the feed portion, the metal bonding pad, and the electrically conductive trace are coplanar.

3. The transparent pane assembly set forth in claim 2, wherein the feed portion, the metal bonding pad, and the electrically conductive trace include matching footprints.

4. The transparent pane assembly set forth in claim 3, wherein the feed portion, the metal bonding pad, and the electrically conductive trace each include a U-shaped element and a central element spaced from the U-shaped element.

5. The transparent pane assembly set forth in claim 4, wherein the U-shaped element is a ground plane and the central element is a transmitting element.

6. The transparent pane assembly set forth in claim 2, wherein the electromagnetic connector assembly includes an adhesive adapted to attach the second face to the second side.

7. The transparent pane assembly set forth in claim 6, wherein the adhesive is located between the electrically conductive trace and the metal bonding pad.

8. The transparent pane assembly set forth in claim 1, wherein the PCB includes a plurality of vias adapted to electrically connect the electrically conductive trace to the coaxial connector.

9. The transparent pane assembly set forth in claim 1, wherein the coaxial connector is a FAKRA connector.

10. The transparent pane assembly set forth in claim 1, wherein the transparent pane includes a first area and a second area adjacent to the first area, and the antenna includes a first portion spanning across the first area and a second portion spanning across the second area, and wherein the first portion is of a density that is greater than the second portion, and the feed portion is electrically connected to the first and second portions.

11. The transparent pane assembly set forth in claim 10, wherein the antenna is coplanar with the transparent pane.

12. The transparent pane assembly set forth in claim 1, wherein the transparent pane is a windshield.

13. The transparent pane assembly set forth in claim 1, wherein the transparent pane is laminated safety glass including a flexible layer disposed between the first and second layers, with the antenna disposed between the flexible layer and the second layer, and wherein the first and second layers are glass layers.

14. The antenna system set forth in claim 1, wherein a footprint of the feed portion and a footprint of the metal bonding pad are matching.

15. The antenna system set forth in claim 14, wherein the footprint of the metal bonding pad matches a footprint of the electrically conductive trace.

16. An automotive windshield assembly comprising:
a transparent pane made at least in-part of a dielectric substrate;
an antenna encased inside the transparent pane, the antenna including an electrically conductive feed portion;
a metallic bonding pad adhered to a face of the transparent pane and aligned to the feed portion for electromagnetic coupling;
a coaxial connector; and
a printed circuit board (PCB), the PCB including opposite first and second sides, a plurality of vias extending between the first and second sides, and an electrically conductive trace carried by the second side, wherein the coaxial connector is electrically connected to the plurality of vias at the second side and the electrically conductive trace is electrically connected to and between the metallic bonding pad and the plurality of vias, and the metallic bonding pad being spaced from the electrically conductive feed portion by the dielectric substrate.

* * * * *